United States Patent [19]

Renner

[11] Patent Number: 4,662,988

[45] Date of Patent: May 5, 1987

[54] SEMICONDUCTOR DEVICES AND THEIR FABRICATION

[75] Inventor: Daniel S. O. Renner, Sawbridgeworth, United Kingdom

[73] Assignee: Standard Telephones and Cables Public Limited Company, London, England

[21] Appl. No.: 729,181

[22] Filed: May 1, 1985

[30] Foreign Application Priority Data

Jun. 28, 1984 [GB] United Kingdom ............... 8416412

[51] Int. Cl.$^4$ .................. H01L 21/306; B44C 1/22; C03C 15/00; C03C 25/06

[52] U.S. Cl. .................. 156/648; 29/569 L; 156/649; 156/651; 156/653; 156/657; 156/659.1; 156/662; 357/17; 357/56; 372/43

[58] Field of Search ............ 156/643, 648, 649, 651, 156/653, 657, 659.1, 662, 661.1; 29/569 L, 576 W, 580; 357/16, 17, 20, 55, 56; 372/43, 45, 46

[56] References Cited

U.S. PATENT DOCUMENTS 4,049,488  9/1977  Tijburg ........................... 156/655
4,468,850  9/1984  Liau et al. .................... 156/649 X
4,496,403  1/1985  Turley ............................ 29/569 L

OTHER PUBLICATIONS

Applied Physics Letter, vol. 41, No. 7, Apr. 1982, pp. 568-570, New York, U.S.; Zl. Liau et al, "A Novel Technique for GaInAsP/InP Buried Heterostructure Laser Fabrication".

Primary Examiner—William A. Powell
Attorney, Agent, or Firm—Kerkam, Stowell, Kondracki & Clarke

[57] ABSTRACT

A method of selectively etching one semiconductor material layer (4) of a multilayer structure which underlies another layer, a top layer (1), of the same or a similar semiconductor material without significantly affecting the top layer (1). The method involves pre-etching both layers (1,4) to provide a stepped structure with recesses (10) under an intermediate layer (5), providing r.f. deposited silicon dioxide (11) over the etched structure such that it is thinnest in the recesses (10) from which it is subsequently selectively removed and etching the layer (4) to the required extent while the top layer (1) is still covered by r.f. silicon dioxide. The method may be used in the manufacture of mass transport buried heterostructure lasers with the layers 1 and 4 of GaInAsP and layers 3 and 5 of InP, the recesses (10) subsequently being filled with InP by a mass transport process. Top layer (1) and intermediate layer (5) may be p-type and layer 3 n-type, top layer (1) providing an electrical contacting layer for the laser.

8 Claims, 4 Drawing Figures

SEMICONDUCTOR DEVICES AND THEIR FABRICATION

BACKGROUND OF THE INVENTION

This invention relates to semiconductor devices and their fabrication and in particular to a selective etching technique.

Multilayered heteroepitaxial wafers are used in the fabrication of a large number of semiconductor components. To define the actual component it is frequently necessary to undercut selectively one or more of these layers. An example of such a component is the mass transport buried heterostructure (MTBH) laser as described, for example, by Z. L. Liau et al. Appl. Phys. Lett. 40 (7) pp 568–570, Apr. 1st, 1982; T. R. Chen et al J. Appl. Phys. 54 (5) pp 2407–2412, Mar 83; or A. Hasson et al. Appl. Phys. Lett. 43(5). pp 403–405, Sept. 1st, 1983).

SUMMARY OF THE INVENTION

According to one aspect of the present invention there is provided a method of selectively etching a first layer of a multilayer structure, which first layer is of the same semiconductor material as, or a similar semiconductor material to, a further layer of the structure spaced apart therefrom by one or more layers of other semiconductor material, the first layer being disposed between two adjacent layers of semiconductor material differing therefrom, the further layer comprising an outermost layer of the structure, which method is required to etch the first layer whilst not significantly etching the further layer, including the steps of pre-etching a small amount of both the first and further layers in such a manner as to define a recess in the first layer between said two adjacent layers, providing etch resistant material on the pre-etched structure in such a manner that at least the remainder of the further layer is covered thereby but the walls of the recess are not so covered, and further etching the first layer a predetermined amount.

According to a further aspect of the present invention there is provided a method of manufacturing a mass transport buried heterostructure laser in a multilayer structure comprising a GaInAsP active layer disposed on an InP layer of one conductivity type, an InP layer of opposite conductivity type disposed on the GaInAsP active layer and a GaInAsP, of opposite conductivity type, contacting layer disposed on the InP layer of opposite conductivity type, including the steps of providing a masking layer with two elongate windows on the GaInAsP contactivity layer, etching through the multilayer structure to the InP layer of one conductivity type via the windows whereby to define a pair of channels with a mesa therebetween, pre-etching with a GaInAsP selective etch a small amount of both GaInAsP layers as exposed by said etching whereby to define a recess under the masking layer and a recess under the InP layer of opposite conductivity type, removing said masking layer and depositing r.f. silicon dioxide on said pre-etched multilayer structure in such a manner that the thickness of the r.f. silicon dioxide in said recess under the InP layer is substantially thinner than elsewhere, etching said r.f. silicon dioxide coated pre-etched multilayer structure for a time consistent with removing the r.f. silicon dioxide from only the walls of the recess under the InP layer, further etching the GaInAsP active layer to provide an active region for the laser, removing the remainder of the r.f. silicon dioxide, performing a mass transport process whereby to fill the etched recess under the InP layer with InP, depositing a silicon dioxide layer on the thus processed multilayer structure, opening in a window in the deposited silicon dioxide layer at the mesa whereby to expose the GaInAsP contacting layer, and depositing a metallisation layer over said deposited silicon dioxide layer and in contact with the exposed GaInAsP contacting layer.

BRIEF DESCRIPTION OF THE DRAWINGS

Embodiments of the invention will now be described with reference to the accompanying drawings, in which.

DESCRIPTION OF THE PREFERRED EMBODIMENTS

Figure 1:
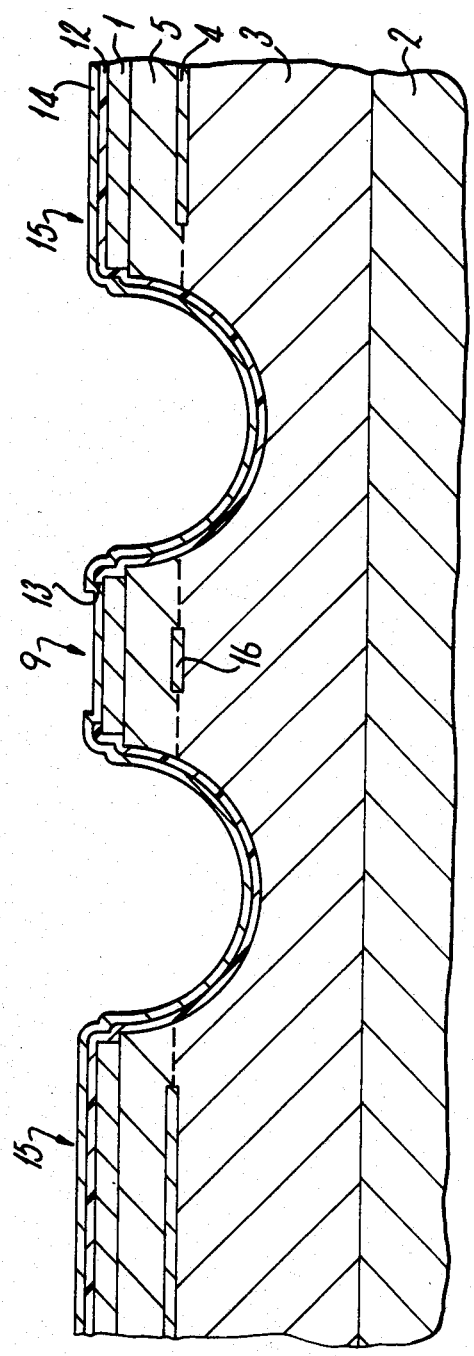
FIG. 1 is a cross-section through a mass transport buried heterostructure (MTBH) laser manufactured by a process including the selective etching technique of the present invention, and FIGS. 2 to 4 indicate, in cross-section, three stages in the selective etching of an active layer in order to produce the structure of FIG. 1.

FIG. 1 shows a schematic cross-section through an MTBH laser structure. This particular structure has a GaInAsP contacting layer 1, rather than, for example, an Au-Zn alloyed contact as described in the first reference mentioned above. The GaInAsP contacting layer provides better electrical contact to the device, improving its cw (continuous wave) operation. The laser structure of FIG. 1 is formed from a multilayer heteroepitaxial wafer comprising an n-type InP substrate 2, an n-type InP epitaxial layer 3, an undoped quaternary GaInAsP active layer 4, a p-type InP epitaxial layer 5 and the quaternary GaInAsP contacting layer 1, which is of p-type. The layers 3, 4, 5 and 1 are grown by conventional liquid phase epitaxy (LPE).

Figure 2:
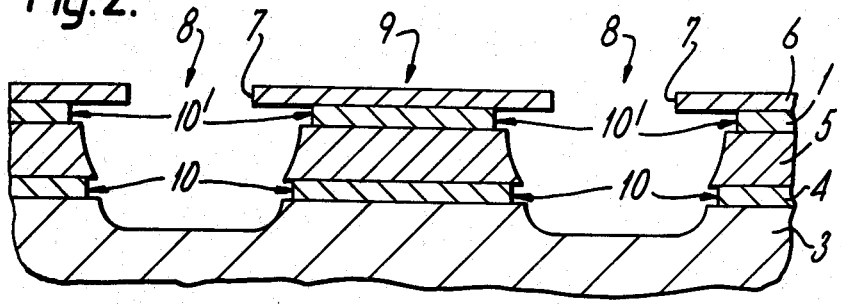

To produce the structure shown in FIG. 1, an etch mask 6 (FIG. 2) is provided on the contacting layer by, for example, coating it with Silox $SiO_2$ and defining double windows 7 therein photolithographically, the windows being elongate in the direction perpendicular to the plane of the section shown. Thus in a subsequent etching process using a non-selective etch to cut through the various epitaxial layers two channels 8 extending perpendicular to the plane of the section of FIG. 2 are defined, which channels are separated by a central mesa 9. The non-selective etch may be comprised by $HCl:CH_3COOH:H_2O_2$ (1:2: 1) (KKI - 121).

After etching the channels 8, and with the etch mask 6 still in position, a quaternary selective etch is used to remove (pre etch) a small fraction (approximately 0.25 μm) of the active layer 4 to create recesses 10 and at the same time a similar small fraction of the contacting layer 1 creating recesses $10^1$ is removed. Typically the quaternary selective etch is comprised of $KOH:K_3Fe(CN)_6 : H_2O$ (3.2 g:4.8 g:28 ml) and the etch time is short, of the order of three seconds. The structure at this stage is as indicated in FIG. 2.

Figure 3:
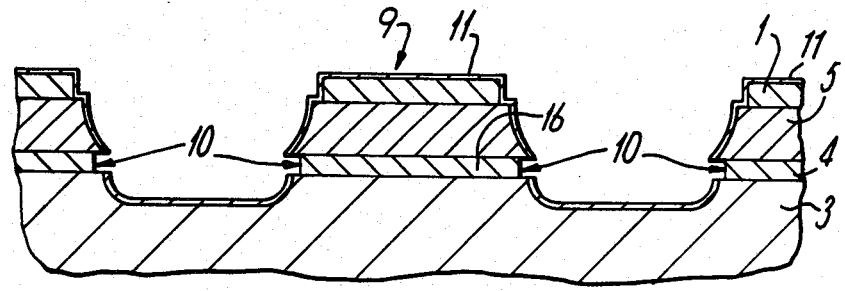
Figure 4:
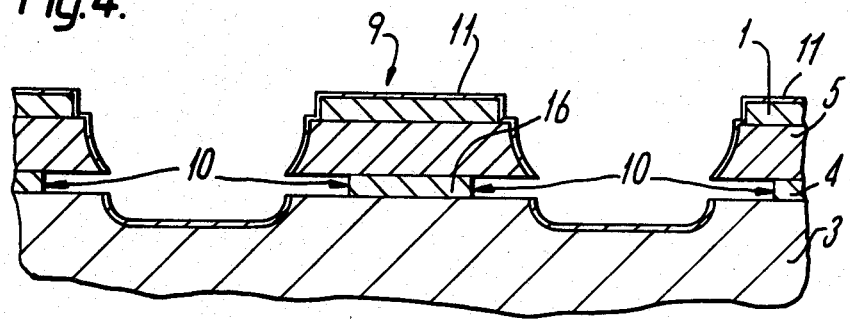

The $SiO_2$ etch mask 6 is next removed and a layer 11 of r.f. $SiO_2$ is deposited over the whole wafer. The layer 11 is approximately 1200 Å (120 nm) thick on the flat surfaces facing the r.f. reaction chamber and it is thinner on surfaces not directly facing the r.f. reaction chamber. It is about 400 Å (40 nm) on vertical walls and less than 100 Å (10 nm) in the recesses 10 in the etched GaInAsP active layer 4 (FIG. 3). The thin layer of SiO$_2$ in the recesses 10 in active layer 4 is removed by etching, for example, for five seconds in buffered HF, whilst still leaving a significant layer thickness of SiO elsewhere. A final etching step is then carried out using a selective quaternary etch, which may be KOH: K$_3$Fe(CN)$_6$:H$_2$O as described above, to increase the depth of the recesses 10 and thus decrease width of the active layer 4 in the mesa 9 to a required value. Since the quaternary contacting layer 1 is protected by the SiO$_2$ 11 further etching thereof does not occur. The structure is then as illustrated in FIG. 4.

In order to produce the MTBH laser structure of FIG. 1 the SiO$_2$ 11 is totally removed from the wafer using, for example buffered HF and a mass transport process carried out to fill the etched recesses 10 of the active layer 4 with InP indicated by dashed lines in FIG. 1. An SiO$_2$ insulating layer 12 is deposited over the entire wafer and a window 13 opened therein at the mesa top by, for example, reactive-ion-etching. A metalisation layer 14 is subsequently deposited and contacts the contacting layer 1 of the mesa 9 via the window 13.

Whereas only the manufacture of one MTBH laser has been described it will be appreciated that a plurality of MTBH laser devices will be manufactured simultaneously in the wafer and subsequently separated from one another and/or further processed in a conventional manner. Each laser device as well as including the mesa active region 9 includes a shoulder 15 on either side of the mesa 9. The shoulders 15 are important for mechanical protection of the laser when subsequently bonding the device to a support. The MTBH laser proper is provided by the mesa active region 9 (FIG. 4) and comprises a quaternary active region 16 totally surrounded by InP (FIG. 1), comprised by layers 3 and 5 and the mass transported regions indicated by the dashed lines. The quaternary active region 16 defines a waveguide in both planes parallel and normal to the junction between InP layers 3 and 5. An applied drive current will flow preferentially through the active region 16, rather than through the two InP p-n junctions in parallel with it, and causing the output of a light beam therefrom. This preferential flow is because of the larger bandgap of InP (1.35 eV) compared with that of GaInAsP (0.95 eV).

Whilst the undercut etching technique of the present invention has been described with respect to a specific heteroepitaxial combination (GaInAsP/InP/GaInAsP-/InP) and the manufacture of MTBH laser devices, it is not to be considered so limited. It can, alternatively, be used for any combination of semiconductor materials where the layer to be undercut is of the same or similar composition as the top layer, which top layer would tend to be removed by the etch if steps were not taken to protect it. Whereas the process described above necessitates the removal of a small portion (0.25 μm) of the top layer when the active layer is initially etched by the selective quaternary etch, it is not significantly affected. The process makes use of the fact that the thickness of r.f. deposited SiO$_2$ (layer 11) depends on the angle between the surface being coated and the direction of the SiO$_2$ source in the r.f. reaction chamber.

Whereas the mass transport process to fill the etched recesses with InP may be carried out in accordance with conventional techniques, such as disclosed in the aforementioned references, it may, alternatively, be carried out as disclosed in our co-pending U.K. Application No. 8416417 (Ser. No. 735,754, filed May 20, 1985, In the name of P. D. Greene—D.S.O. Renner 11-1).

I claim:

1. A method of selectively etching a first layer of a multilayer structure, which first layer is of the same semiconductor as a further layer of the structure spaced apart from the first layer by at least one layer of different semiconductor material, the first layer being disposed between two adjacent layers of semiconductor material, which adjacent layers are of different semiconductor material to the first layer, the further layer comprising an outermost layer of the structure, which method is required to etch the first layer whilst not significantly etching the further layer, including the steps of pre-etching a small amount of both the first and further layers, the pre-etching step defining a recess in the first layer between said two adjacent layers, providing etch resistant material on the pre-etched structure, the etch resistant material covering at least the remainder of the further layer but not the walls of the recess, and further etching the first layer a predetermined amount.

2. A method as claimed in claim 1, wherein prior to said pre-etching step a masking layer is disposed on said further layer, wherein during said pre-etching step a recess is defined in said further layer under said masking layer, and wherein said masking layer is removed before the provision of the etch resistant material.

3. A method as claimed in claim 2, wherein following disposition of the masking layer on said further layer and before said pre-etching step a window is opened in said masking layer and the multilayer structure is etched through the window whereby to expose the first and further layers and the at least one layer therebetween.

4. A method as claimed in claim 1, wherein the etch resistant material is comprised of silicon dioxide provided by a radio frequency plasma technique whereby the pre-etched structure is provided with a coating of silicon dioxide which is substantially thinner on the walls of the recess associated with the first layer than elsewhere, and wherein prior to said further etching of the first layer the coated pre-etched structure is etched for a time consistent with removing the silicon dioxide coating from only the walls of the recess associated with the first layer.

5. A method as claimed in claim 1, wherein the first and further layers are of GaInAsP, wherein the first and further layers are spaced apart by a first InP layer and wherein the first layer is disposed between said first InP layer and a further InP layer.

6. A method as claimed in claim 5 and for use in the manufacture of mass transport buried heterostructure lasers, wherein the first layer is an active GaInAsP layer which is further etched to provide the active region of the laser, wherein the further layer is of p-type GaInAsP and comprises an electrical contacting layer for the laser, wherein the first InP layer is p-type and wherein the further InP layer is n-type.

7. A method of manufacturing a mass transport buried heterostructure layer in a multilayer structure comprising a GaInAsP active layer disposed on an InP layer of one conductivity type, an InP layer of opposite conductivity type disposed on the GaInAsP active layer and a GaInAsP, of opposite conductivity type, contacting layer disposed on the InP layer of opposite conductivity type, including the steps of providing a masking layer with two elongate windows on the GaInAsP contacting layer, etching through the multilayer structure to the InP layer of one conductivity type via the windows whereby to define a pair of channels with a mesa therebetween, pre-etching with a GaInAsP selective etch a small amount of both GaInAsP layers as exposed by said etching whereby to define a recess under the masking layer and a recess under the InP layer of opposite conductivity type, removing said masking layer and depositing a layer of silicon dioxide by a radio frequency plasma technique on said pre-etched multilayer structure, the thickness of said layer of silicon dioxide in said recess under the InP layer being substantially thinner than elsewhere, etching said silicon dioxide coated pre-etched multilayer structure for a time consistent with removing said layer of silicon dioxide from only the walls of the recess under the InP layer, further etching the GaInAsP active layer to provide an active region for the laser, removing the remainder of said layer of silicon dioxide, performing a mass transport process whereby to fill the etched recess under the InP layer with InP, depositing a further silicon dioxide layer on the thus processed multilayer structure, opening a window in the deposited further silicon dioxide layer at the mesa whereby to expose the GaInAsP contacting layer, and depositing a metallization layer over said deposited further silicon dioxide layer and in contact with the exposed GaInAsP contacting layer.

8. A method of select etching a first layer of a multilayer structure, which first layer is of a similar semiconductor material to a further layer of the structure spaced apart from the first layer by at least one layer of different semiconductor material, the first layer being disposed between two adjacent layers of semiconductor material, which adjacent layers are of different semiconductor material to the first layer, the further layer comprising an outermost layer of the structure, which method is required to etch the first layer whilst not significantly etching the further layer, including the steps of pre-etching the first and further layers, the pre-etching step defining a recess in the first layer between said adjacent layers, providing etch resistant material on the pre-etched structure, the etch resistant material covering at least the remainder of the further layer but not the walls of the recess, a further etching the first layer a predetermined amount.

* * * * *